United States Patent
DeLaCruz et al.

(10) Patent No.: US 12,431,449 B2
(45) Date of Patent: *Sep. 30, 2025

(54) CIRCUITRY FOR ELECTRICAL REDUNDANCY IN BONDED STRUCTURES

(71) Applicant: ADEIA SEMICONDUCTOR BONDING TECHNOLOGIES INC., San Jose, CA (US)

(72) Inventors: Javier A. DeLaCruz, San Jose, CA (US); Belgacem Haba, Saratoga, CA (US); Jung Ko, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 18/339,964

(22) Filed: Jun. 22, 2023

(65) Prior Publication Data
US 2023/0395544 A1    Dec. 7, 2023

Related U.S. Application Data

(63) Continuation of application No. 17/125,899, filed on Dec. 17, 2020, now Pat. No. 11,721,653.
(Continued)

(51) Int. Cl.
*H01L 23/00*    (2006.01)
*G01R 31/27*    (2006.01)
(Continued)

(52) U.S. Cl.
CPC ............ *H01L 24/06* (2013.01); *G01R 31/275* (2013.01); *G01R 31/2856* (2013.01); *H01L 24/08* (2013.01); *H01L 25/0657* (2013.01)

(58) Field of Classification Search
CPC ...... H01L 24/06; H01L 24/08; H01L 25/0657
See application file for complete search history.

(56) References Cited

U.S. PATENT DOCUMENTS

| 5,753,536 A | 5/1998 | Sugiyama et al. |
| 5,771,555 A | 6/1998 | Eda et al. |
(Continued)

FOREIGN PATENT DOCUMENTS

| JP | 2013-033786 A | 2/2013 |
| JP | 2018-160519 | 10/2018 |
(Continued)

OTHER PUBLICATIONS

Sohail O., "Sony has released the Smartphone Industry's first 48MP Sensor that goes beyond recording 4K Footage at 60FPS". Release of IMX586; Jul. 23, 2018, downloaded from https://wccftech.com/sony-releases-48mp-smartphone-sensor/ on May 3, 2024, 4 pages.
(Continued)

*Primary Examiner* — Nathan W Ha
(74) *Attorney, Agent, or Firm* — Knobbe, Martens, Olson & Bear, LLP

(57) ABSTRACT

A bonded structure is disclosed. The bonded structure can include a first element that has a first plurality of contact pads. The first plurality of contact pads includes a first contact pad and a second redundant contact pad. The bonded structure can also include a second element directly bonded to the first element without an intervening adhesive. The second element has a second plurality of contact pads. The second plurality of contact pads includes a third contact pad and a fourth redundant contact pad. The first contact pad is configured to connect to the third contact pad. The second contact pad is configured to connect to the fourth contact pad. The bonded structure can include circuitry that has a first state in which an electrical signal is transferred to the first contact pad and a second state in which the electrical signal is transferred to the second contact pad.

23 Claims, 6 Drawing Sheets

Related U.S. Application Data

(60) Provisional application No. 62/953,084, filed on Dec. 23, 2019.

(51) Int. Cl.
  *G01R 31/28* (2006.01)
  *H01L 25/065* (2023.01)

(56) References Cited

U.S. PATENT DOCUMENTS

| | | |
|---|---|---|
| 6,080,640 A | 6/2000 | Gardner et al. |
| 6,255,899 B1 | 7/2001 | Bertin et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,385,283 B2 | 6/2008 | Wu et al. |
| 7,750,488 B2 | 7/2010 | Patti et al. |
| 7,803,693 B2 | 9/2010 | Trezza |
| 8,183,127 B2 | 5/2012 | Patti et al. |
| 8,259,461 B2 | 9/2012 | Hollis |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,064,862 B2 | 6/2015 | Hwang et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,748,206 B1 | 8/2017 | Huang et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,797,037 B1 | 10/2020 | Lin |
| 10,804,255 B1 | 10/2020 | Agarwal et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 11,380,597 B2 | 7/2022 | Katkar et al. |
| 11,721,653 B2 * | 8/2023 | DeLaCruz ............ G01R 31/275 257/786 |
| 11,842,894 B2 | 12/2023 | Katkar et al. |
| 12,046,583 B2 | 7/2024 | Katkar et al. |
| 12,218,107 B2 | 2/2025 | Katkar et al. |
| 2004/0084414 A1 | 5/2004 | Sakai et al. |
| 2005/0184398 A1 | 8/2005 | Zhou et al. |
| 2006/0057945 A1 | 3/2006 | Hsu et al. |
| 2007/0111386 A1 | 5/2007 | Kim et al. |
| 2011/0050320 A1 * | 3/2011 | Gillingham ............ H01L 21/82 327/365 |
| 2011/0292708 A1 | 12/2011 | Kang et al. |
| 2011/0316572 A1 | 12/2011 | Rahman |
| 2013/0214410 A1 | 8/2013 | Khan et al. |
| 2014/0175655 A1 | 6/2014 | Chen et al. |
| 2014/0293705 A1 * | 10/2014 | Gillingham ............ H01L 25/18 365/185.18 |
| 2015/0064498 A1 | 3/2015 | Tong |
| 2015/0085195 A1 | 3/2015 | Pereira et al. |
| 2015/0206824 A1 | 7/2015 | Ramachandra et al. |
| 2015/0243611 A1 | 8/2015 | Liu et al. |
| 2015/0333056 A1 | 11/2015 | Du et al. |
| 2015/0346279 A1 | 12/2015 | Douskey et al. |
| 2015/0380341 A1 | 12/2015 | Chiou et al. |
| 2016/0005716 A1 | 1/2016 | Yu et al. |
| 2016/0118095 A1 * | 4/2016 | Pelley ................ H01L 25/0657 365/230.01 |
| 2016/0181228 A1 | 6/2016 | Higuchi et al. |
| 2016/0343682 A1 | 11/2016 | Kawasaki |

(56) References Cited

U.S. PATENT DOCUMENTS

| | | |
|---|---|---|
| 2017/0069593 A1 | 3/2017 | Chou et al. |
| 2017/0125383 A1 | 5/2017 | Liu |
| 2017/0250160 A1 | 8/2017 | Wu et al. |
| 2018/0012868 A1 | 1/2018 | Wu et al. |
| 2018/0040547 A1 | 2/2018 | Zuo et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0323952 A1 | 11/2018 | Chang et al. |
| 2018/0331066 A1 | 11/2018 | Uzoh et al. |
| 2019/0013295 A1 | 1/2019 | Wu et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2019/0385982 A1 | 12/2019 | Lee et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0035643 A1 | 1/2020 | Hirata et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0279821 A1 | 9/2020 | Haba et al. |
| 2020/0286875 A1 | 9/2020 | Nishida et al. |
| 2020/0294908 A1 | 9/2020 | Haba et al. |
| 2020/0294918 A1 | 9/2020 | Nishida et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0395339 A1 | 12/2020 | Chen et al. |
| 2020/0402959 A1 | 12/2020 | Eom et al. |
| 2020/0411483 A1 | 12/2020 | Uzoh et al. |
| 2021/0020601 A1 | 1/2021 | Chen et al. |
| 2021/0035943 A1 | 2/2021 | Ramm |
| 2021/0082865 A1 | 3/2021 | Baraskar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0143921 A1 | 5/2021 | Nasrullah et al. |
| 2021/0181510 A1 | 6/2021 | Katkar et al. |
| 2021/0193603 A1* | 6/2021 | DeLaCruz ....... G01R 31/31717 |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0384133 A1 | 12/2021 | Ong et al. |
| 2021/0407941 A1 | 12/2021 | Haba |
| 2022/0020741 A1 | 1/2022 | DeLaCruz et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0075833 A1 | 3/2023 | Choi et al. |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420419 A1 | 12/2023 | Katkar et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0136333 A1 | 4/2024 | Katkar et al. |
| 2024/0162178 A1 | 5/2024 | DeLaCruz et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |

(56) References Cited

U.S. PATENT DOCUMENTS

| | | | |
|---|---|---|---|
| 2025/0096191 A1 | 3/2025 | Gao et al. | |
| 2025/0112123 A1 | 4/2025 | Katkar et al. | |

FOREIGN PATENT DOCUMENTS

| | | |
|---|---|---|
| KR | 20190059857 A | 5/2019 |
| KR | 20190122794 A | 10/2019 |
| WO | WO 2005/043584 A2 | 5/2005 |
| WO | WO 2021/133671 A1 | 7/2021 |

OTHER PUBLICATIONS

Calderoni, Alessandro, "Memory Devices and Selectors for High-Density Memory Technology," International Electron Devices Meeting, Short Course 2: Technologies for Memory-Centric Computing, Dec. 8, 2019, 330 pages.
Derbyshire, Katherine, "The Darker Side of Hybrid Bonding," Semiconductor Engineering, Dec. 17, 2020, 6 pages.
International Search Report and Written Opinion mailed Apr. 21, 2021, International Application No. PCT/US2020/066001, 10 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Peters, Laura, "The Path To Known Good Interconnects," semiengineering.com/the-path-to-known-good-interconnects, Jan. 19, 2023, 13 pages (printed Jan. 24, 2023).
Plobi, A. et al., "Wafer direct bonding: tailoring adhesion between brittle materials," Materials Science and Engineering Review Journal, 1999, R25, 88 pages.
Bush, Steve, "Electronica: Automotive power modules from On Semi," ElectronicsWeekly.com, indicating AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023) ("Bush article").
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part No. "ONSEMI AR0820.".
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

* cited by examiner

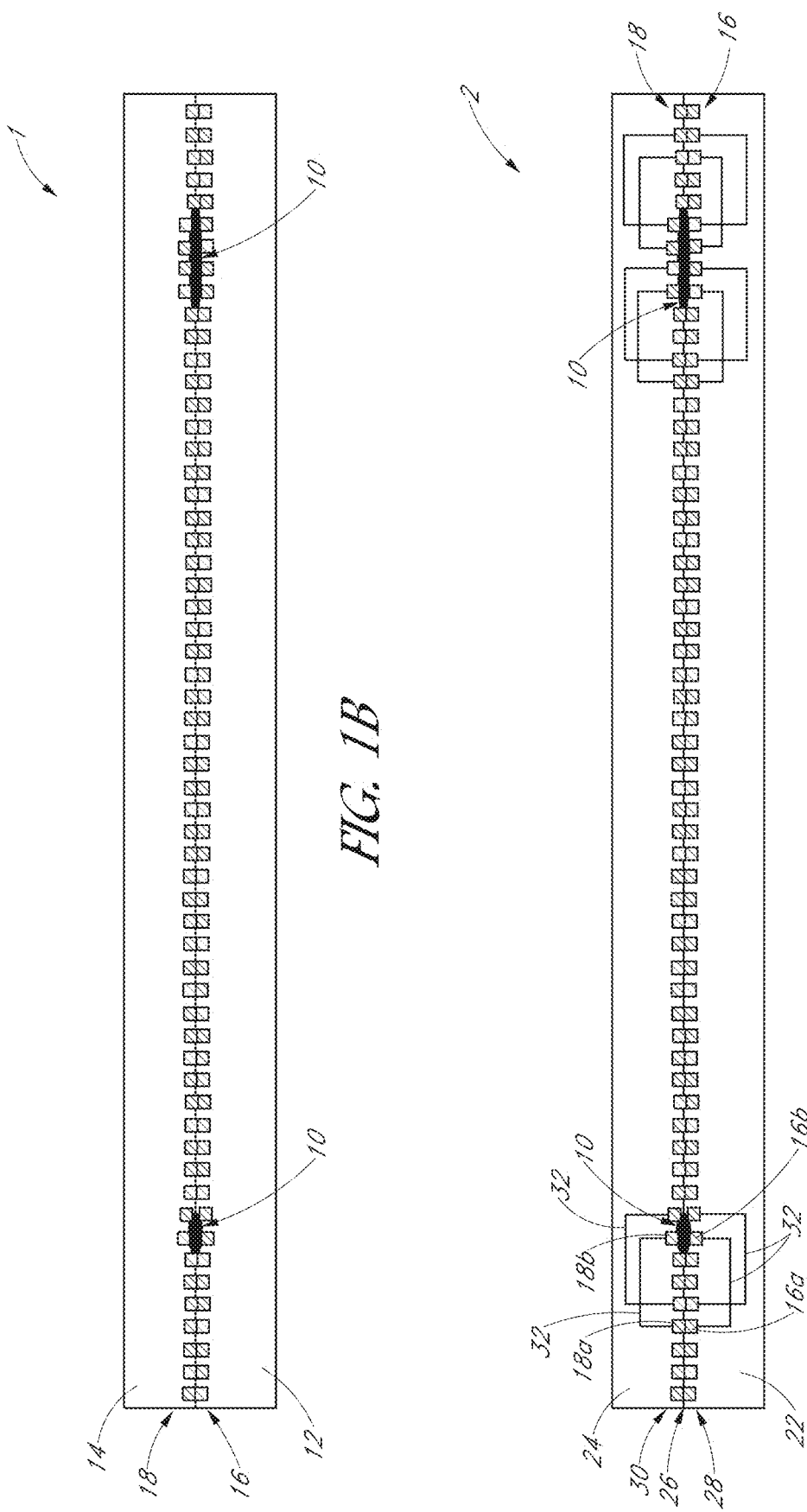

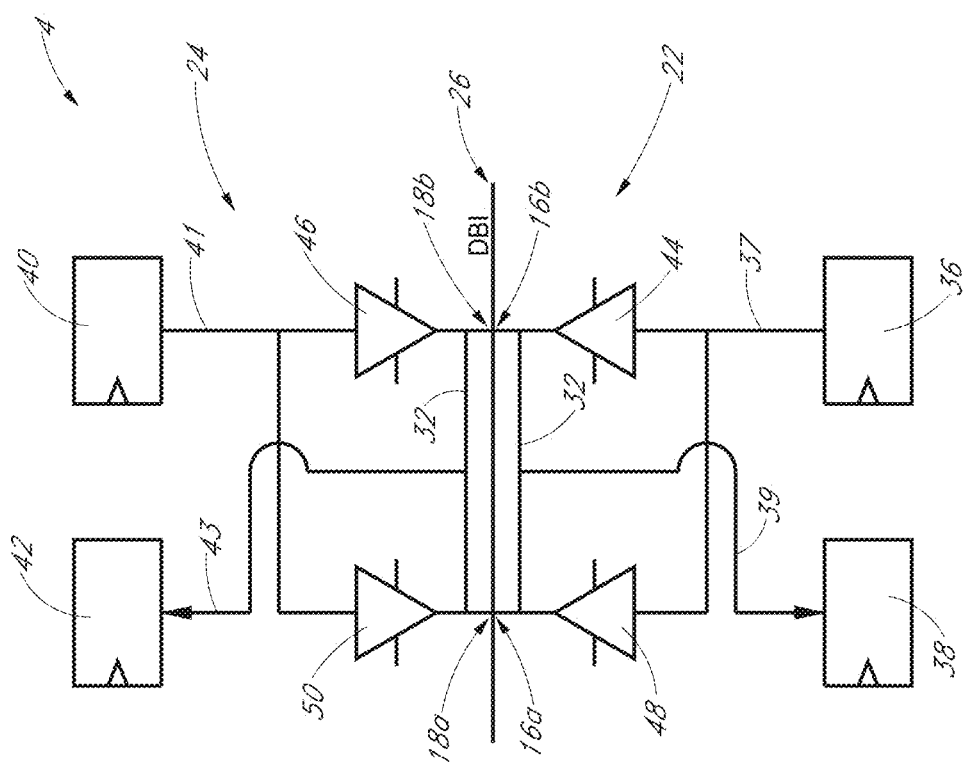
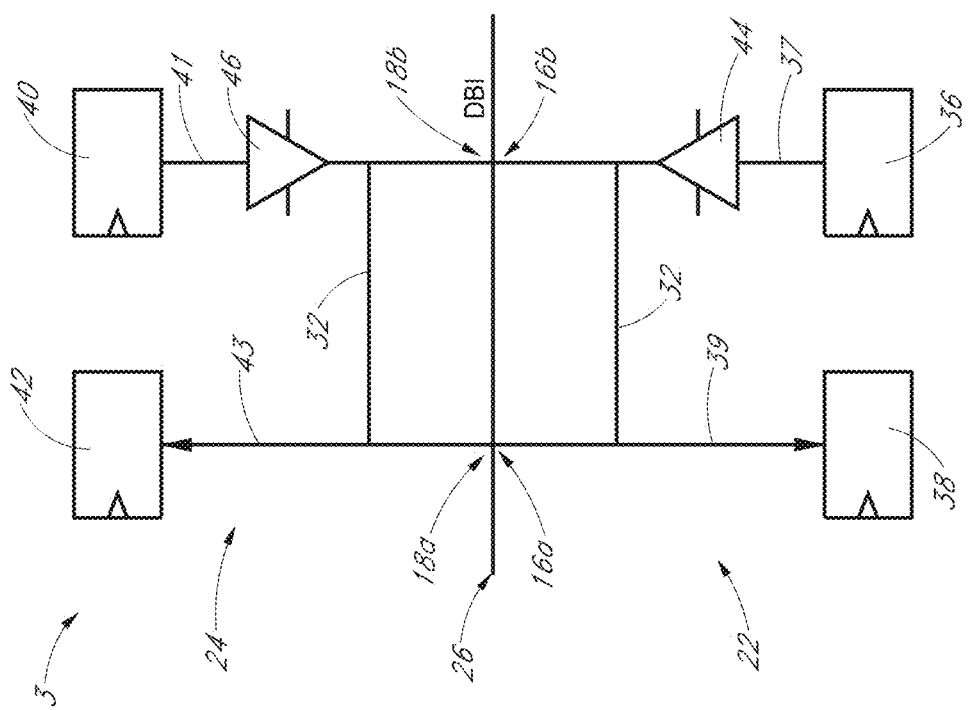
FIG. 2A
FIG. 2B

US 12,431,449 B2

CIRCUITRY FOR ELECTRICAL REDUNDANCY IN BONDED STRUCTURES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The field relates to circuitry for electrical redundancy in bonded structures.

Description of the Related Art

Multiple semiconductor elements (such as integrated device dies) may be stacked on top of one another in various applications, such as high bandwidth memory (HBM) devices or other devices that utilize vertical integration. The stacked elements can electrically communicate with one another through arrays of contact pads. It can be important to ensure that the electrical connections between contact pads on two stacked elements are reliable.

BRIEF DESCRIPTION OF THE DRAWINGS

Specific implementations will now be described with reference to the following drawings, which are provided by way of example, and not limitation.

FIG. 1B is a schematic cross sectional view of the bonded structure of FIG. 1A.

FIG. 1C is a schematic cross sectional view of a bonded structure according to an embodiment.

FIG. 2A illustrates switching circuitry comprising a bi-directional circuit according to an embodiment.

FIG. 2B illustrates switching circuitry comprising a bi-directional circuit according to another embodiment.

DETAILED DESCRIPTION OF THE PREFERRED EMBODIMENT

Figure 1A:
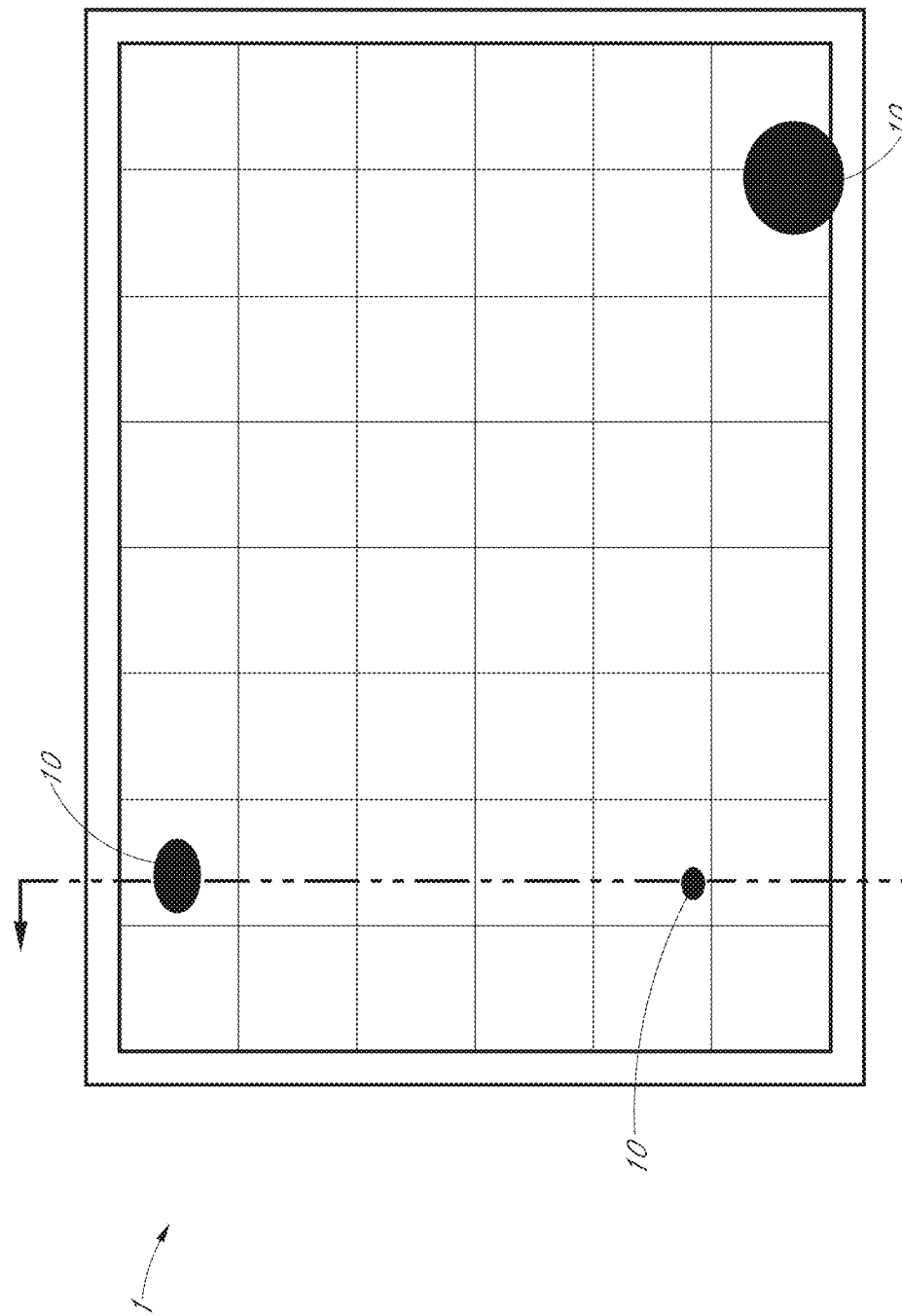
FIG. 1A is a schematic top plan view of a bonded structure showing locations of voids.

Two or more semiconductor elements (such as integrated device dies) may be stacked on or bonded to one another to form a bonded structure. Conductive contact pads of one element may be electrically connected to corresponding conductive contact pads of another element. Any suitable number of elements can be stacked in the bonded structure. In some embodiments, the elements are directly bonded to one another without an adhesive. In other embodiments, the elements may be bonded with a conductive adhesive, such as solder, etc.

In various embodiments, a dielectric field region of a first element (e.g., a first semiconductor device die with active circuitry) can be directly bonded (e.g., using dielectric-to-dielectric bonding techniques) to a corresponding dielectric field region of a second element (e.g., a second semiconductor device die with active circuitry) without an adhesive. For example, dielectric-to-dielectric bonds may be formed without an adhesive using the direct bonding techniques disclosed at least in U.S. Pat. Nos. 9,391,143 and 10,434,749, the entire contents of each of which are incorporated by reference herein in their entirety and for all purposes. Dielectrics that can be treated and activated for direct bonding include, for example, inorganic dielectrics, particularly those including silicon, such as silicon oxide (SiO), silicon nitride (SiN), silicon carbide (SiC), silicon oxynitride (SiON), silicon oxycarbide (SiOC), silicon carbonitride (SiCN), etc.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric bonds can be formed using the direct hybrid bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive. Conductive contact pads (which may be surrounded by nonconductive dielectric field regions) may also directly bond to one another without an intervening adhesive. In some embodiments, the respective contact pads can be recessed below the dielectric field regions, for example, recessed by less than 20 nm, less than 15 nm, or less than 10 nm, for example, recessed in a range of 2 nm to 20 nm, or in a range of 4 nm to 10 nm. The dielectric field regions can be initially directly bonded to one another without an adhesive and without external pressure at room temperature in some embodiments and, subsequently, the bonded structure can be annealed. Upon annealing, the contact pads can expand and contact one another to form a metal-to-metal direct bond. Beneficially, the use of the hybrid bonding techniques known by the trade name Direct Bond Interconnect, or DBI®, can enable high density of pads connected across the direct bond interface (e.g., small or fine pitches for regular arrays) and/or high density of pads connected across the direct bond interface (e.g., small or fine pitches for regular arrays). In some embodiments, the pitch of the bonding pads may be less 40 microns or less than 10 microns or even less than 2 microns. For some applications the ratio of the pitch of the bonding pads to one of the dimensions of the bonding pad is less than 5, or less than 3 and sometimes desirably less than 2. In various embodiments, the contact pads can comprise copper, although other metals may be suitable.

In various embodiments, the contact pads can be formed in respective first and second arrays of pads on the first and second elements. If any debris or surface contaminant is present at the surface of the first or second elements, voids may be created at the bond interface, or debris may intervene between opposing contact pads. In addition, reactant byproducts generated during bonding and annealing, e.g. hydrogen and water vapor, may also form voids at the bond interface. These voids may effectively inhibit the joining of particular contact pads in the vicinity, creating openings or other failures in the bond. For example, any void larger than the pad diameter (or pitch) can potentially create an opening and direct bond failure.

FIG. 1A is a schematic top plan view of a bonded structure 1 showing locations of voids 10. FIG. 1B is a schematic cross sectional view of the bonded structure 1. The bonded structure 1 has voids 10 between a first element 12 and a second element 14. The voids 10 can intervene between opposing contact pads 16, 18. The voids 10 can cause faulty interconnects.

FIG. 1C is a schematic cross sectional view of a bonded structure 2 according to an embodiment. The bonded structure 2 can comprise a first element 22 (e.g., a first semiconductor device die) and a second element 24 (e.g., a second semiconductor device die) stacked on and bonded to the first element 22 along a bonding interface 26. Corresponding dielectric field regions (e.g., a first dielectric field region 28 and a second dielectric field region 30) and corresponding contact pads (e.g., first contact pads 16 and second contact pads 18) may be directly bonded without an intervening adhesive. The bonded structure 2 can include one or more trace(s) 32 can provide a redundant electrical connection. Thus, in the event of a void or debris (fault 10) the traces 32 ensure the desired connection between the elements 22, 24. Although not shown, it will be understood that the contact pads 16, 18 each connect internally to circuitry of their respective elements 22, 24, and that the traces ensure redundant connections of multiple pads to such internal circuitry. The bonded structure 2 can include switching circuitry that is connected to the trace(s) 32.

Beneficially, various embodiments disclosed herein can provide circuitry (e.g., switching circuitry) for electrical redundancy such that if a first electrical connection between first and second elements fails, the failed electrical connection can be rerouted or switched through a redundant electrical connection between the first and second elements. The disclosed embodiments can accordingly improve device yield by ensuring that electrical connectivity between stacked dies remains even when one or more interconnection between the elements has failed, e.g., if a void or debris (fault 10) is disposed between contact pads of the elements.

Having the redundant pads close to one another risks both or all of the redundant pads being affected by the same bonding fault (e.g., void or debris). Spacing redundant electrical interconnects relatively far apart makes it more likely that if one connection is compromised by a bonding fault, a redundant pad can ensure the electrical connection to the other die is not lost. Embodiments disclosed herein can beneficially enable the use of redundant pads at relatively large spacings without significant electrical losses. The use of active circuitry can enable high frequency operation at large distances with little electrical loss.

In various embodiments, the bonded structure can include first and second elements (e.g., first and second active integrated device dies) bonded to one another. Each element can comprise corresponding first and second pluralities of contact pads that can be electrically connected to one another to define a plurality of electrical connections along the bonding interface between the first and second elements. The connections can include contacts configured to carry relatively high frequency signals (e.g., greater than about 50 Mhz, greater than about 100 MHz, or greater than 200 MHz). In some embodiments, the connectivity of electrical connections between the first and second elements can be tested to identify one or more failed electrical connections (for example, connections in which a void, debris or other fault is disposed between opposing contact pads). In various embodiments, a boundary scan or built-in self-test (BIST) engine can be used to determine connectivity. For example, the BIST engine can run a boundary scan diagnostic which identifies the faulty connections and verifies that there are functional alternate locations that can work before connections are reassigned or rerouted. An e-fuse or other similar mechanisms, along with non-volatile look-up tables (LUTs) can logically reassign the electrical connections to redundant connections. The reassignment or switching of connections can feed both sides of the connections (at least two dies involved) so that the linkage and connection is completed.

Thus, based upon available connectivity, a subset of spare pins or contact pads to be reassigned to the broken interconnects can be identified. The one or more failed electrical connections can be rerouted or reassigned to one or more redundant electrical connections on both sides of the bonding interface (e.g., on both dies) to complete the desired connection between the first and second elements. The reroutings or reassignments can be implemented by switches or multiplexers (MUXes) to re-route the nets. A longer distance can be enabled by reconditioning the signal with flops, redrivers, retimers, inverters, repeaters or similar structures disposed along the route or at the circuitry (e.g., at switching circuitry). By leveraging circuitry such as a switch or a multiplexer, the electrical load of the alternate electrical paths should not consume power other than leakage power, which may occur from the repeaters (or other logic) used to carry the signal to the alternate location.

The electrical connectivity of the plurality of electrical connections can be re-tested to verify connectivity of the one or more redundant electrical connections. For example, in some embodiments, the boundary scan can be re-run with the reassignments to validate the self-repair of the failed electrical connection. The embodiments disclosed herein can be used in conjunction with directly bonded structures, as described above, but may also be used with other interconnections, such as copper pillars, solder balls, etc.

In FIG. 1C, the bonded structure 2 employs circuitry in each of first and second elements 22, 24 to selectively re-route signals to alternate or redundant contact pads. As explained above, the first and second elements 22, 24 can be bonded to one another along a bonding interface 26. In the illustrated embodiment, the first and second elements 22, 24 are directly bonded to one another without an adhesive. For example, as explained above, corresponding first and second dielectric field regions 28, 30 of the first and second elements 22, 24 may be directly bonded without an adhesive. Corresponding first and second pluralities of contact pads 16, 18 of the first and second elements 22, 24 may also be directly bonded to one another without an intervening adhesive. For example, the two bonded elements 22, 24 can be hybrid bonded such that respective dielectric regions 28, 30 are directly bonded without an adhesive and respective contact pads 16, 18 are directly bonded without an adhesive. In FIG. 1C, the first element 22 includes first and second contact pads 16a, 16b spaced apart from one another. In some embodiments, the first and second contact pads 16a, 16b can be spaced apart from one another by at least 10 microns, at least 50 microns, or at least 100 microns, for example, in a range of 10 microns to 5 mm, in a range of 10 mm to 1 mm, or in a range of 50 microns to 1500 microns. In some embodiments, the first and second contact pads 16a, 16b can be spaced apart by at least twice a pitch of the plurality of contact pads 16, or at least 5 times the pitch. The second element 18 includes third and fourth contact pads 18a, 18b spaced apart from one another. The third and fourth pads 18a, 18b can be spaced apart by a spacing similar to that of the first and second pads 16a, 16b. The first and third contact pads 16a, 18a can be disposed opposite one another and configured to electrically connect to one another. Similarly, the second and fourth contact pads 16b, 18b can be disposed opposite one another and configured to electrically connect to one another. In other embodiments, conductive adhesives may be used between corresponding contact pads along the bonding interface.

FIGS. 2A-2B illustrate examples of circuitry 3, 4 comprising respective bi-directional circuits, including tri-stated interconnections. Reference numerals used in conjunction with FIGS. 2A and 2B may represent the same or generally similar components as those of FIG. 1C, unless otherwise noted. First transmit and receive flip-flops 36, 38 can be provided in the first element 22. Second transmit and receive flip-flops 40, 42 can be provided in the second element 24. The first and second transmit flip-flops 36, 40 can comprise transmit transistors, and the first and second receive flip-flops 38, 42 can comprise receive transistors. The flip-flops 36, 38, 40, 42 can each comprise a single-transistor flip-flop and/or a multi-transistor flip-flop. An output line 37 of the first transmit flip-flop 36 can be electrically connected at least partially through the trace 32 to an input line 39 of the first receive flip-flop 38 and to the second contact pad 16b. The input line 39 of the first receive flip-flop 38 is connected to the first contact pad 16a. An output line 41 of the second transmit flip-flop 40 can be electrically connected at least partially through the trace 32 to an input line 43 of the second receive flip-flop 42 and to the fourth contact pad 18b. The input line 43 of the second receive flip-flop 42 is connected to the third contact pad 18a.

In various embodiments, if, for example, an electrical connection between the second and fourth contact pads 16b, 18b is faulty, the signal can be rerouted to a redundant electrical connection between the first and third contact pads 16a, 18a. Similarly, if an electrical connection between the first and third contact pads 16a, 18a is faulty, the signal can be rerouted to a redundant electrical connection between the second and fourth contact pads 16b, 18b. Therefore, the circuitry 3, 4 can have a first state in which an electrical signal is transferred between the first and third contact pads 16a, 18a and a second state in which the electrical signal is transferred between the second and fourth contact pads 16b, 18b.

The circuitry 3, 4 can comprise a first tri-state driver 44 and a second tri-state driver 46 that enable tri-stated interconnections. In some embodiments, the first tri-state driver 44 can be positioned between the first transmit flip-flop 36 and the trace 32 that connects the first and second contact pads 16a, 16b. In some embodiments, the second tri-state driver 46 can be positioned between the second transmit flip-flop 40 and the trace 32 that connects the third and fourth contact pads 18a, 18b. The circuitry 4 can comprise a third tri-state driver 48 and a fourth tri-state driver 50. As shown in FIG. 2B, in some embodiments, the third tri-state driver 48 can be positioned between the first receive flip-flop 36 and the trace 32 that connects the first and second contact pads 16a, 16b. In some embodiments, the fourth tri-state driver 50 can be positioned between the second receive flip-flop 42 and the trace 32 that connects the third and fourth contact pads 18a, 18b.

Figure 2D:
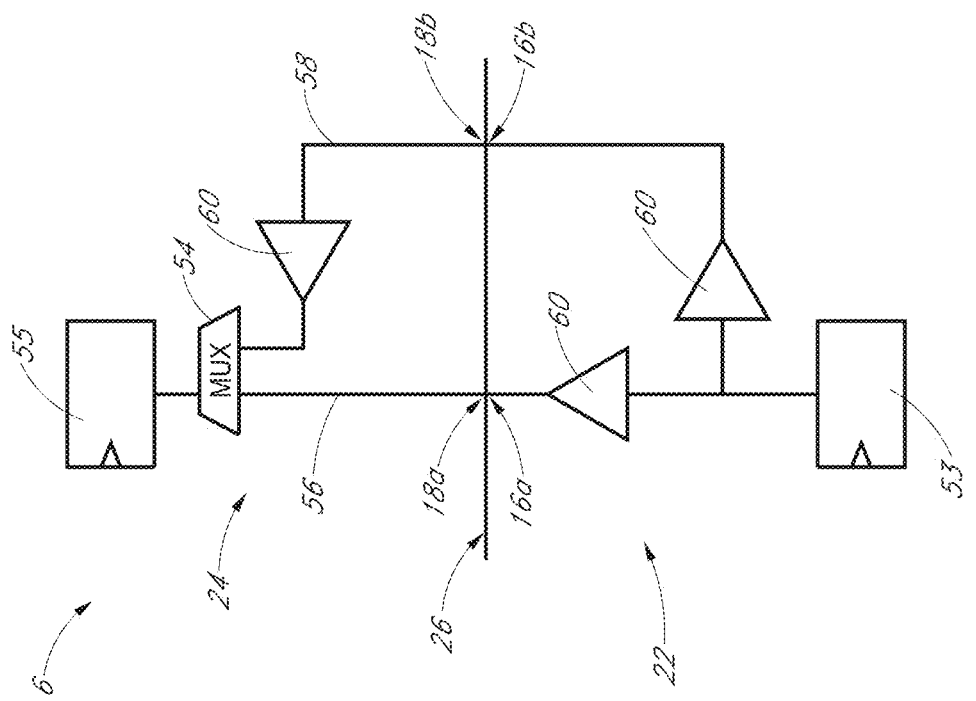
FIG. 2D illustrates switching circuitry comprising a multiplexer (MUX) according to an embodiment.
Figure 2C:
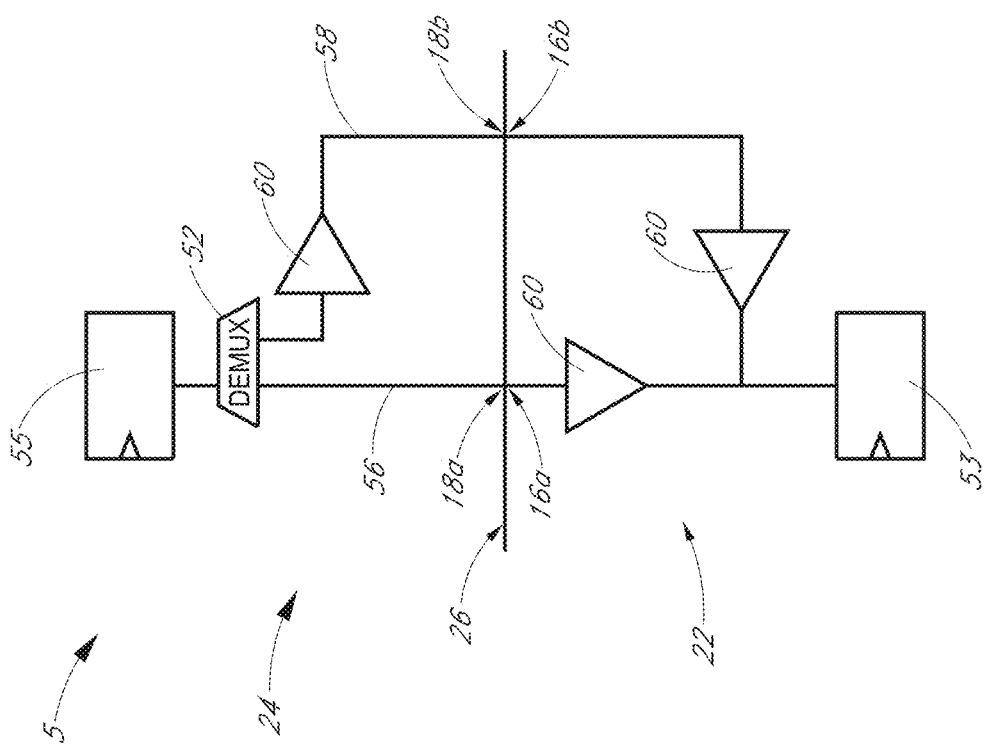
FIG. 2C illustrates switching circuitry comprising a demultiplexer (DEMUX) according to an embodiment.

FIGS. 2C-2D illustrate another example of circuitry 5, 6 that includes a multiplexer (MUX) 54 or demultiplexer (DEMUX) 52 in at least one of the first and second elements. Reference numerals used in conjunction with FIGS. 2C and 2D may represent the same or generally similar components as those of FIGS. 1C-2B, unless otherwise noted. FIG. 2C shows a DEMUX device. In FIG. 2D, a MUX device can be used. The circuitry 5, 6 can include a first and second transistors 53, 55. The circuitry 5 can connect the second transistor 55 to an input of the DEMUX 52, and the circuitry 6 can connect the second transistor to an output of the MUX 54. As shown in FIGS. 3A and 3B, the DEMUX 52 and/or MUX 54 in the second element 24 can be configured to select which of first and second electrical paths 56, 58 are to be used for a particular electrical signal. One or more repeaters 60 can also be provided along the first and second paths 56, 58. If it is determined that a first electrical connection between first and third pads 16a, 18a is faulty, for example, the DEMUX 52 and/or MUX 54 can switch to route the electrical signal along the second path 58 to the redundant connection between the second and fourth pads 16b, 18b.

In the illustrated embodiments, the DEMUX 52 and the MUX 54 are configured to select between the first and second electrical paths 56, 58, and a 1-to-2 demultiplexer and a 2-to-1 multiplexer are used as the DEMUX 52 and the MUX 54 respectively. However, in some embodiments, the circuitry 5, 6 can be configured to select between more than two electrical paths and implement other types of DEMUX and MUX.

Figure 3:
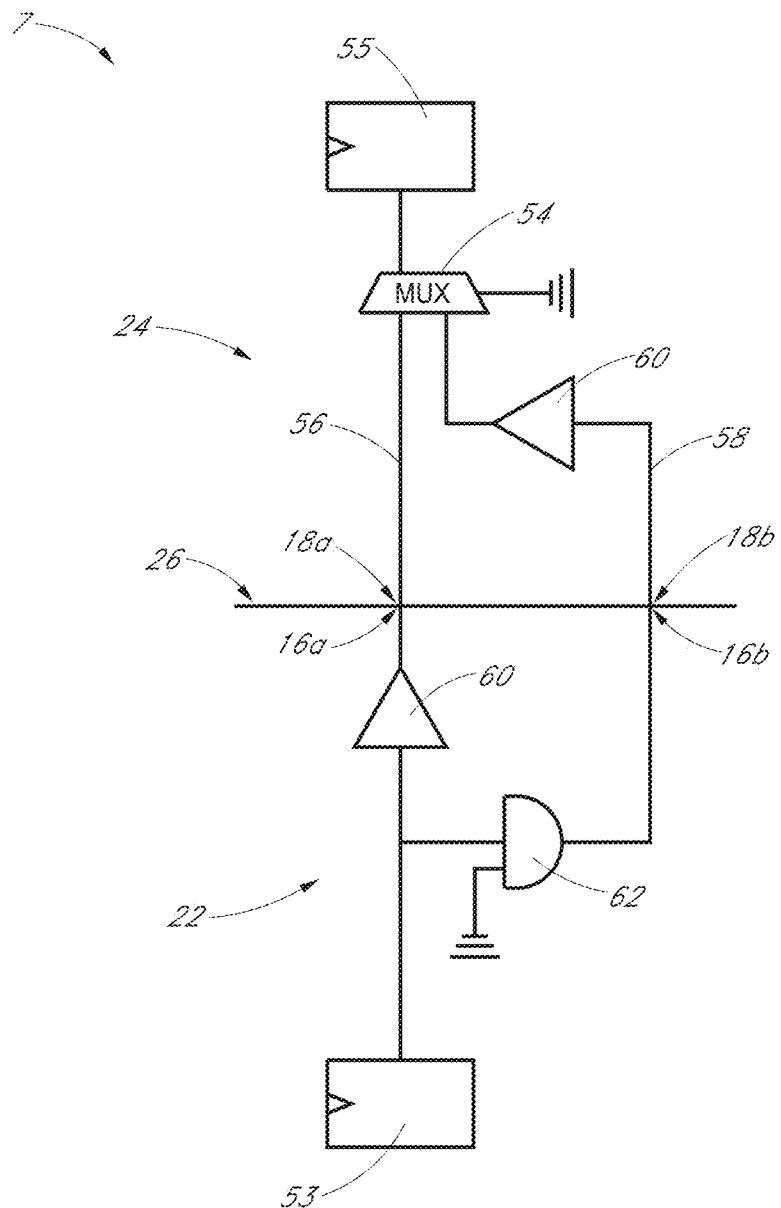
FIG. 3 illustrates switching circuitry comprising an AND gate according to an embodiment.

FIG. 3 illustrates another example of circuitry 7 that includes an AND gate 62 in one or both of the first and second elements 22, 24. Reference numerals used in conjunction with FIG. 3 may represent the same or generally similar components as those of FIGS. 1C-2D, unless otherwise noted. Similar to the embodiment of FIGS. 2C and 2D, if both inputs to the AND gate 62 indicate a good connection, then the electrical signal can be transferred along the second path 58 to the second and fourth pads 16b, 18b (or the first path 56 to the first and third pads 16a, 18a). If one of the inputs to the AND gate 62 indicates a faulty connection (e.g., when the second and fourth pads 16b, 18b have a faulty connection), then the electrical signal can be transferred along the first path 56 to the first and third pads 16a, 18a. Although FIG. 3 illustrates an AND gate 62, it should be appreciated that other types of logic gates or active circuitry can be used to switch between electrical pathways to the bonding interface.

Figure 4:
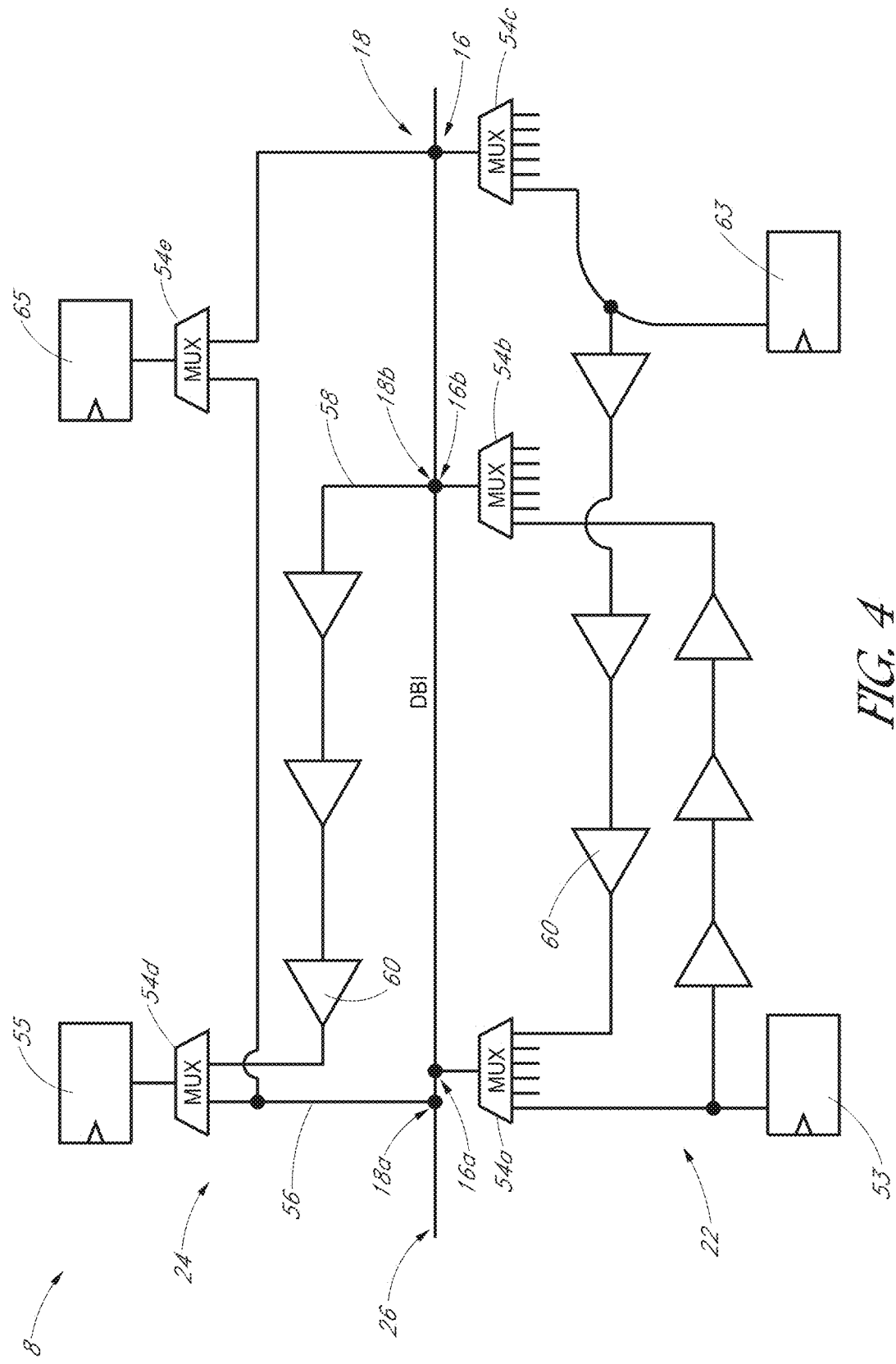
FIG. 4 illustrates switching circuitry comprising a plurality of multiplexers (MUX) according to an embodiment.

FIG. 4 illustrates another example of circuitry 8 that includes a hash topology including a plurality of multiplexers (MUX) 54a, 54b, 54c, 54d, 54e in the first and second elements 22, 24. Reference numerals used in conjunction with FIG. 4 may represent the same or generally similar components as those of FIGS. 1C-3, unless otherwise noted. The hash topology can enable the use of many-to-many interconnections, as opposed to one-to-one or many-to-one. As shown in FIG. 4, the first flip-flop 53 can electrically connect to a plurality of multiplexers 54a, 54b, 54c, which can receive the electrical signal from the first flip-flop 53. If the electrical connection along the bonding interface 26 is faulty for one of the plurality of MUX 54a, 54b, 54c, 54d, 54e, then another of the MUX 54a, 54b, 54c, 54d, 54e can transfer the electrical signal to a corresponding contact pad at the bonding interface 26. Also, one or a plurality of repeaters 60 can be provided along the signal lines so as to boost or repeat the signal along possibly large distances, which can maintain high signal quality. The use of the hash topology can beneficially increase redundancy for the bonded structure, since each MUX 54a, 54b, 54c, 54d, 54e can connect to multiple flip-flops 53, 55, 63, 65 on a particular element.

For example, for each contact pad, accordingly, there may be more than one redundant pad, which can share signal boosters, flops, retimers, drivers, inverters, etc. Thus, the many-to-many redundancy of FIG. 4 enables every pin or contact pad to potentially access multiple redundant pads. For example, if there are 100 original pads or pins and 10 redundant pads, then each of the 100 pins can access each of the 10 redundant pads. This example can correct for 10 faults, but any suitable number of redundancies can be provided. For example, in some embodiments, a ratio of a first plurality of operational contact pads to a second plurality of redundant contact pads can be in a range of 2:1 to 15:1, or in a range of 5:1 to 10:1.

The foregoing described actively connected redundant pads for signals. In some embodiments, each of the first and second elements 22, 24 can comprise corresponding ground and power pads. Passively connected redundant pads can be provided for the ground and power pads. The redundant ground and power pads can be passively connected, for example, without active circuitry along the interconnecting path. Passively connected redundant pads can be spaced apart from the corresponding faulty power or ground pad by at least 10 microns, or at least 50 microns. Passively connected redundant pads can be spaced apart from the corresponding faulty power or ground pad by at least twice a pitch (e.g., twice a minimum pitch) of the contact pads.

Beneficially, the embodiments disclosed herein can provide electrical redundancy for connections across a bonding interface 26 between two bonded elements 22, 24. The disclosed embodiments can be used for signals at relatively high frequencies, since active devices (such as repeaters, flops, redrivers, retimers, inverters, etc.) can be provided to recondition the signal, even across relatively large distances. Thus, even for significantly increased point-to-point distances (for example, distances in a range of 0.3 mm to 1 mm, or greater than 1 mm) for a given signal shunted to a redundant pad due to a faulty connection, signal strength at high frequencies can be maintained. In various embodiments, the disclosed embodiments can be operated at frequencies of 50 MHz or greater, 100 MHz or greater, or 200 MHz or greater.

The illustrated embodiments accordingly illustrates circuitry 3, 4, 5, 6, 7, 8 that reroutes signal(s) from one contact pad to another, redundant contact pad. Although the illustrated embodiments show surface pads with various or arbitrary types of internal, lateral connections, the concepts disclosed herein can be applicable to through substrate vias (TSVs), whether the TSVs are internal to the element or pass therethrough. If the TSVs pass completely through a particular element, then the circuitry can provide for switching between outer dies of a stack (e.g., with one or more intervening elements).

Thus, in one embodiment, a bonded structure is disclosed. The bonded structure can include a first element having a first plurality of contact pads on a first surface, the first plurality of contact pads including a first contact pad and a second redundant contact pad spaced apart from one another along the first surface. The bonded structure can include a second element bonded to the first element. The second element can have a second plurality of contact pads on a second surface. The second plurality of contact pads can include a third contact pad and a fourth redundant contact pad spaced apart from one another along the second surface. The first contact pad can be disposed opposite to and configured to connect to the third contact pad. The second contact pad can be disposed opposite to and configured to connect to the fourth contact pad. The bonded structure can include circuitry disposed in at least the first element, the circuitry having a first state in which an electrical signal is transferred to the first contact pad and a second state in which the electrical signal is transferred to the second contact pad.

In some embodiments, the bonded structure can include second circuitry in the second element, the second circuitry having a first state in which an electrical signal is transferred to the third contact pad and a second state in which the electrical signal is transferred to the fourth contact pad. The circuitry can form at least a portion of a bidirectional tri-stated interconnect structure. The circuitry can comprise a first receive flip-flop and a first transmit flip-flop, an output line of the first transmit flip-flop electrically connected to an input line of the first receive flip-flop and to the second contact pad, the input line of the first receive flip-flop connected to the first contact pad. The second circuitry can comprise a second receive flip-flop and a second transmit flip-flop, an output line of the second transmit flip-flop electrically connected to an input line of the second receive flip-flop and to the fourth contact pad, the input line of the first receive flip-flop connected to the third contact pad. The circuitry can comprise a multiplexer (MUX) or demultiplexer (DEMUX) electrically connected to a first flip-flop, and wherein the MUX or DEMUX is configured to selectively transfer the electrical signal to the first contact pad or the second contact pad. The bonded structure can comprise a second flip-flop in the second element, the MUX or DEMUX configured to transfer the electrical signal to the second flip-flop along a first path through the first contact pad or along a second path through the second contact pad. The circuitry can comprise an AND gate configured to selectively transfer the electrical signal to the first contact pad or the second contact pad. The circuitry can comprise a first plurality of multiplexers (MUX) electrically connected to a first flip-flop in the first element. A first MUX of the first plurality of MUX can be configured to transfer the electrical signal to the first contact pad. The first MUX can be configured to receive the electrical signal from the first flip-flop or a second electrical signal from a second flip-flop in the first element. A second MUX of the first plurality of MUX can be configured to receive the electrical signal from the first flip-flop and to transfer the electrical signal to the second contact pad. The second circuitry can comprise a second plurality of multiplexers (MUX) electrically connected to a second flip-flop. The first plurality of contact pads can be directly bonded to the second plurality of contact pads without an intervening adhesive. The bonded structure can comprise first and second dielectric field regions on the first and second elements, the first and second dielectric field regions directly bonded to one another without an adhesive. A void can be disposed between at least a portion of the first and third contact pads, and wherein the second and fourth contact pads can be physically and electrically contact one another. The first and third contact pads may not be directly electrically connected to one another. The circuitry can be in the second state. The first and second contact pads can be spaced apart by at least 50 microns. The first and second contact pads can be spaced apart by at least twice a pitch of the first plurality of contact pads.

In another embodiment, a method of providing electrical connectivity along a bonding interface of a bonded structure including a first element bonded to a second element is disclosed. The method can include testing electrical connectivity of a plurality of electrical connections between the first element and the second element to identify one or more failed electrical connections. The method can include rerouting the identified one or more failed electrical connections to one or more redundant electrical connections between the first and second elements.

The method can include re-testing the electrical connectivity of the plurality of electrical connections to verify connectivity of the one or more redundant electrical connections. The first element can be directly bonded to the second element without an intervening adhesive.

In another embodiment, a bonded structure is disclosed. The bonded structure can include a first element having a first plurality of operational contact pads and a second plurality of redundant contact pads, wherein the first plurality of operational contact pads includes more contact pads than the second plurality of redundant contact pads. The bonded structure can include a second element bonded to the first element. The second element can have a third plurality of operational contact pads and a fourth plurality of redundant contact pads. The first plurality of operational contact pads can be disposed opposite to and configured to connect to the third plurality of operational contact pads. The second plurality of redundant contact pads can be disposed opposite to and configured to connect to the fourth plurality of redundant contact pads. The bonded structure can include circuitry disposed in at least the first element, the circuitry configured to transfer one or more electrical signals from a first number of pads from the first plurality of operational pads to a second number of pads from the second plurality of redundant pads, the first number greater than the second number.

In some embodiments, a ratio of the first plurality to the second plurality and of the third plurality to the fourth plurality can be in a range of 2:1 to 15:1. The ratio of the first plurality to the second plurality and of the third plurality to the fourth plurality can be in a range of 5:1 to 10:1. The first plurality of operational contact pads can comprise signal pads. Each of the first and second elements can further comprise corresponding ground and power pads. The bonded structure can include passively connected redundant pads for the ground and power pads.

In another embodiment, a bonded structure is disclosed. The bonded structure can include a first element having a first plurality of through substrate vias (TSVs), the first plurality of TSVs including a first TSV and a second redundant TSV spaced apart from one another. The bonded structure can include a second element stacked on a first side of the first element, the second element having a plurality of contact pads. The plurality of contact pads can include a first contact pad and a second redundant contact spaced apart from one another. The first TSV can be disposed opposite to and configured to connect to the first contact pad. The second TSV can be disposed opposite to and configured to connect to the second contact pad. The bonded structure can include circuitry disposed in at least the second element, the circuitry connecting the first contact pad with the second contact pad, the circuitry having a first state in which an electrical signal is transferred to the first TSV and a second state in which the electrical signal is transferred to the second redundant TSV.

In some embodiments, the bonded structure can include a third element stacked on a second side of the first element opposite to the first side. The third element can have a second plurality of contact pads. The second plurality of contact pads can include a third contact pad and a fourth redundant contact pad spaced apart from one another. The third contact pad can be disposed opposite to and configured to connect to the first TSV. The fourth contact pad can be disposed opposite to and configured to connect to the second TSV. The circuitry can be disposed in the first and/or third element. The first state can transfer the electrical signal along the first contact pad, the first TSV and the third contact pad. The second state can transfer the electrical signal along the second contact pad, the second TSV and the fourth contact pad. One or more of the first through fourth contact pads can be connected to TSVs in the first and/or third elements.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A bonded structure comprising:
a first element having a first plurality of contact pads at a first surface, the first plurality of contact pads including a first contact pad and a second contact pad spaced apart from one another along the first surface;
a second element hybrid bonded to the first element without an intervening adhesive, the second element having a second plurality of contact pads at a second surface, the second plurality of contact pads including a third contact pad and a fourth contact pad spaced apart from one another along the second surface, wherein the first contact pad is disposed opposite to the third contact pad, and wherein the second contact pad is disposed opposite to the fourth contact pad; and
switching circuitry for selectively transferring an electrical signal either through the first and third contact pads or through the second and fourth contact pads, thereby providing redundant connections between the first and second elements.

2. The bonded structure of claim 1, wherein the switching circuitry comprises at least a first portion disposed in the first element, the circuitry having a first state in which the electrical signal is transferred to the first contact pad and a second state in which the electrical signal is transferred to the second contact pad.

3. The bonded structure of claim 1, wherein the switching circuitry comprises a second portion disposed in the second element, the second portion having a first state in which the electrical signal is transferred to the third contact pad and a second state in which the electrical signal is transferred to the fourth contact pad.

4. The bonded structure of claim 3, wherein the switching circuitry forms at least a portion of a bidirectional tri-stated interconnect structure.

5. The bonded structure of claim 4, wherein:
the first portion of the switching circuitry comprises a first receive flip-flop and a first transmit flip-flop, an output line of the first transmit flip-flop electrically connected to an input line of the first receive flip-flop and to the second contact pad, the input line of the first receive flip-flop connected to the first contact pad; and
the second portion of the switching circuitry comprises a second receive flip-flop and a second transmit flip-flop, an output line of the second transmit flip-flop electrically connected to an input line of the second receive flip-flop and to the fourth contact pad, the input line of the first receive flip-flop connected to the third contact pad.

6. The bonded structure of claim 3, wherein:
the first portion of the switching circuitry comprises a multiplexer (MUX) or demultiplexer (DEMUX) electrically connected to a first flip-flop, and wherein the MUX or DEMUX selectively transfers the electrical signal to the first contact pad or the second contact pad; and
the second portion of the switching circuitry comprises a second flip-flop in the second element, the MUX or DEMUX selectively transferring the electrical signal to the second flip-flop along a first path through the first contact pad or along a second path through the second contact pad.

7. The bonded structure of claim 3, wherein the first portion of the switching circuitry comprises an AND gate configured to selectively transfer the electrical signal to the first contact pad or the second contact pad.

8. The bonded structure of claim 3, wherein the first portion of the switching circuitry comprises a first plurality of multiplexers (MUX) electrically connected to a first flip-flop in the first element, wherein a first MUX of the first plurality of MUX transfers the electrical signal to the first contact pad.

9. The bonded structure of claim 8, wherein the first MUX receives the electrical signal from the first flip-flop or a second electrical signal from a second flip-flop in the first element, and a second MUX of the first plurality of MUX receives the electrical signal from the first flip-flop and transfers the electrical signal to the second contact pad.

10. The bonded structure of claim 1, wherein a void is disposed between at least a portion of the first and third contact pads, and wherein the second and fourth contact pads physically and electrically contact one another.

11. The bonded structure of claim 10, wherein the first and third contact pads are not directly electrically connected to one another.

12. The bonded structure of claim 1, wherein the first and second contact pads are spaced apart by at least 50 microns.

13. The bonded structure of claim 1, wherein the first and second contact pads are spaced apart by at least twice a pitch of the first plurality of contact pads.

14. A bonded structure comprising:
a first element having a first plurality of operational contact pads and a second plurality of redundant contact pads at a bonding interface, wherein the first plurality of operational contact pads includes more contact pads than the second plurality of redundant contact pads;
a second element hybrid bonded to the first element without an intervening adhesive, the second element having a third plurality of operational contact pads and a fourth plurality of redundant contact pads at the bonding interface, wherein the first plurality of operational contact pads are disposed opposite to the third plurality of operational contact pads, and wherein the second plurality of redundant contact pads are disposed opposite to the fourth plurality of redundant contact pads; and
switching circuitry for selectively transferring one or more electrical signals from selected pads from the first plurality of operational pads to selected pads from the second plurality of redundant pads, wherein each pad of the second plurality of redundant pads can be selectively connected to any one of multiple pads of the first plurality of operational pads.

15. The bonded structure of claim 14, wherein a ratio of the first plurality to the second plurality and of the third plurality to the fourth plurality is in a range of 2:1 to 15:1.

16. The bonded structure of claim 15, wherein a ratio of the first plurality to the second plurality and of the third plurality to the fourth plurality is in a range of 5:1 to 10:1.

17. The bonded structure of claim 14, wherein the first plurality of operational contact pads comprise signal pads.

18. The bonded structure of claim 14, wherein each of the first and second elements further comprise corresponding ground and power pads, further comprising passively connected redundant pads for the ground and power pads.

19. The bonded structure of claim 14, wherein each pad of the first plurality of first operational contact pads is spaced from each pad of the second plurality of redundant contact pads by at least 10 microns.

20. The bonded structure of claim 14, wherein the switching circuitry has transferred an electrical signal from a first operational pad of the first plurality of first operational contact pads to a second redundant pad of the second plurality of redundant contact pads, wherein the first operational pad is spaced from the second redundant pad by at least 50 microns.

21. The bonded structure of claim 14, wherein each pad of the first plurality of operational pads can be selectively connected to any one of multiple pads of the second plurality of redundant pads.

22. The bonded structure of claim 21, wherein each pad of the first plurality of operational pads can be selectively connected to any one of the second plurality of redundant pads.

23. The bonded structure of claim 14, wherein each pad of the second plurality of redundant pads can be selectively connected to any one of 2-15 pads of the first plurality of operational pads.

* * * * *